United States Patent [19]

Susuki et al.

[11] Patent Number: 4,737,845

[45] Date of Patent: Apr. 12, 1988

[54] METHOD OF LOADING SURFACE MOUNTED DEVICE AND AN APPARATUS THEREFOR

[75] Inventors: Kenji Susuki, Ebina; Seiji Hata, Fujisawa; Yoshien Nishida, Yokohama; Kyoichi Kawasaki; Kenjiro Fujii, both of Funabashi; Yasunori Shimura, Chiba; Shigenori Takeyoshi, Abiko, all of Japan

[73] Assignee: Hitachi, Ltd., Tokyo, Japan

[21] Appl. No.: 896,864

[22] Filed: Aug. 15, 1986

[30] Foreign Application Priority Data

Oct. 11, 1985 [JP] Japan ............................... 60-224852
May 20, 1986 [JP] Japan ............................... 61-113586

[51] Int. Cl.$^4$ .............................................. H04N 7/18
[52] U.S. Cl. ....................................... 358/101; 382/8; 901/47
[58] Field of Search ................ 358/101; 382/8; 901/47

[56] References Cited

U.S. PATENT DOCUMENTS 4,604,648 8/1986 Kley ..................... 358/101
4,626,907 12/1986 Schedewie ................. 358/101
4,628,464 12/1986 McConnell ................. 358/101

FOREIGN PATENT DOCUMENTS 60-15780 1/1985 Japan ..................... 901/47

Primary Examiner—Howard W. Britton
Attorney, Agent, or Firm—Fay, Sharpe, Beall, Fagan, Minnich & McKee

[57] ABSTRACT

A method and an apparatus for grasping surface mounted devices such as an IC or the like by the hand of the robot and automatically and accurately loading them onto the contact pattern of the printed board by use of an image processor are disclosed. According to this method, a measurement line is provided onto each image pattern of the pin array of the surface mounted device and the array of the contact pattern of the board, so that it may intersect at right angles with the direction of the pattern, and each position of the pin array and the array of the contact pattern is sought from the variation of the brightness on that line. In accordance with the result thus obtained, displacement of the position and that of the rotation over the entire surfaced part and the contact pattern are sought and the operation of the robot is controlled in accordance with that information.

15 Claims, 20 Drawing Sheets

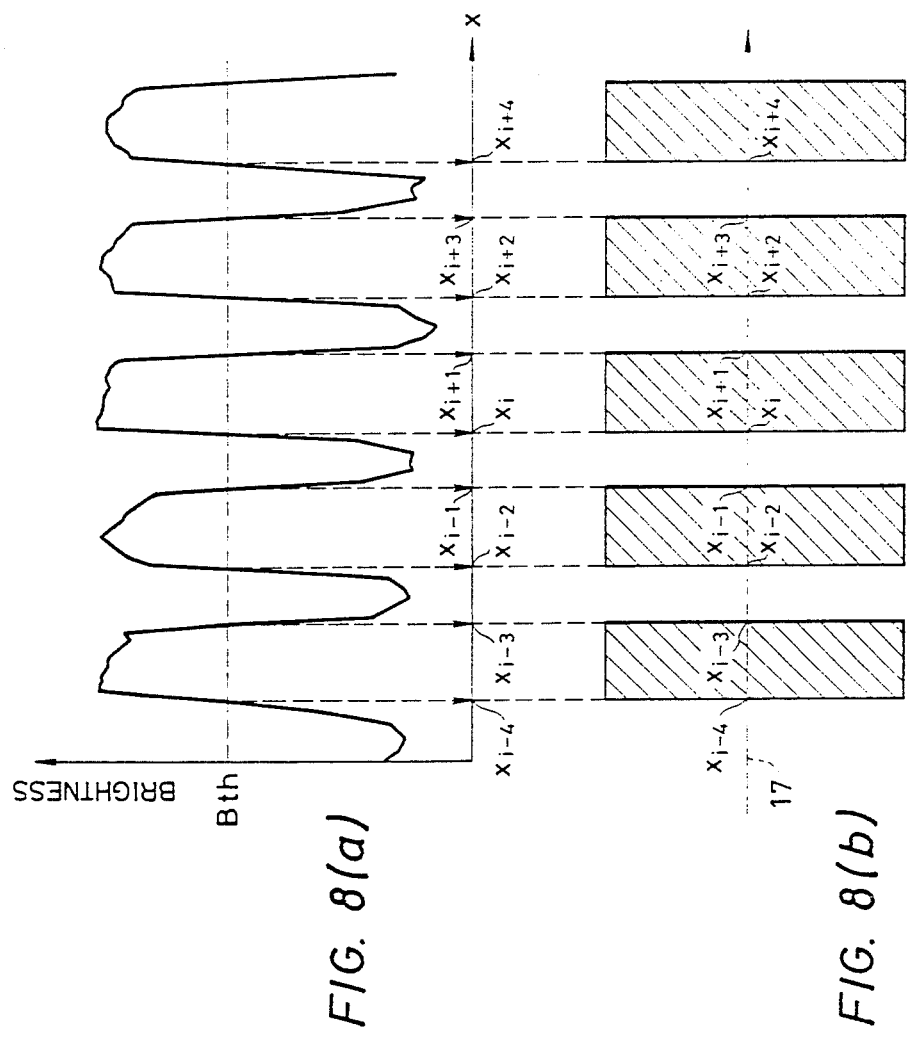

FIG. 11
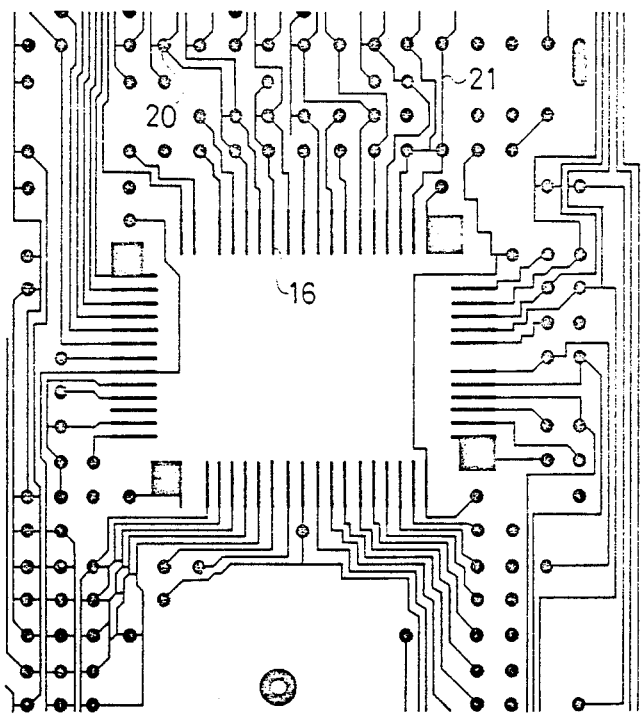
FIG. 12(a)
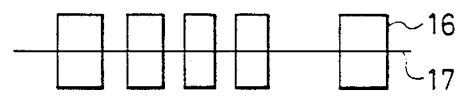
FIG. 12(b)
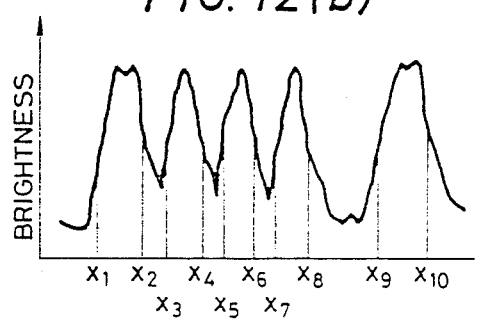
FIG. 12(c)
| 0 |
|---|
| $x_2$ |
| $x_3$ |
| $x_4$ |
| $x_5$ |
| $x_6$ |
| $x_7$ |
| $x_8$ |
| $x_9$ |
| 0 |

FIG. 13(a)
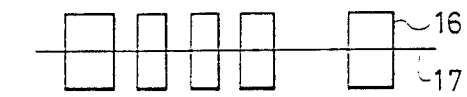
FIG. 13(b)
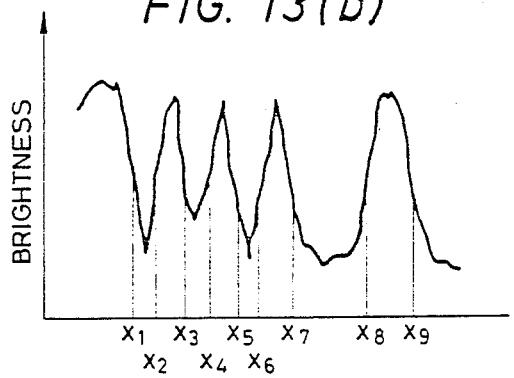
FIG. 13(c)
| |
|---|
| 0 |
| $x_1$ |
| $x_2$ |
| $x_3$ |
| $x_4$ |
| $x_5$ |
| $x_6$ |
| $x_7$ |
| $x_8$ |
| 0 |
FIG. 14(a)
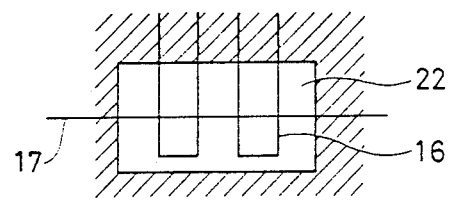
FIG. 14(b)
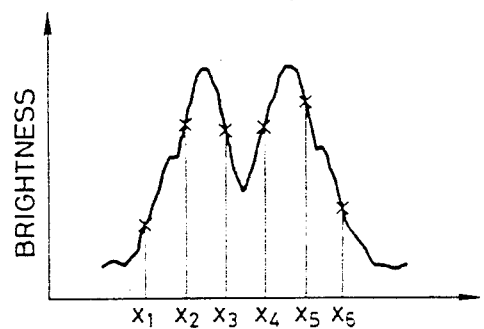

FIG. 16(a)
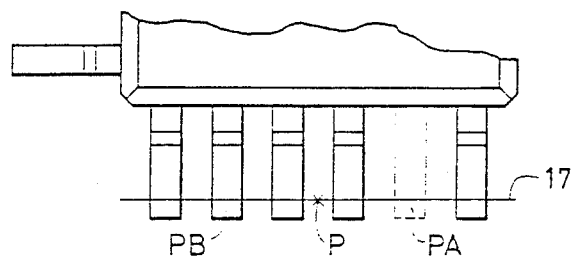
FIG. 16(b)
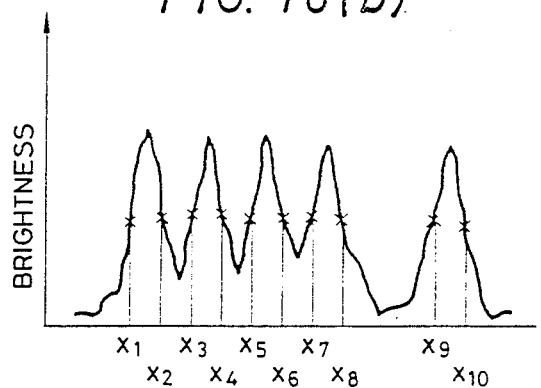
FIG. 16(c)    FIG. 16(d)

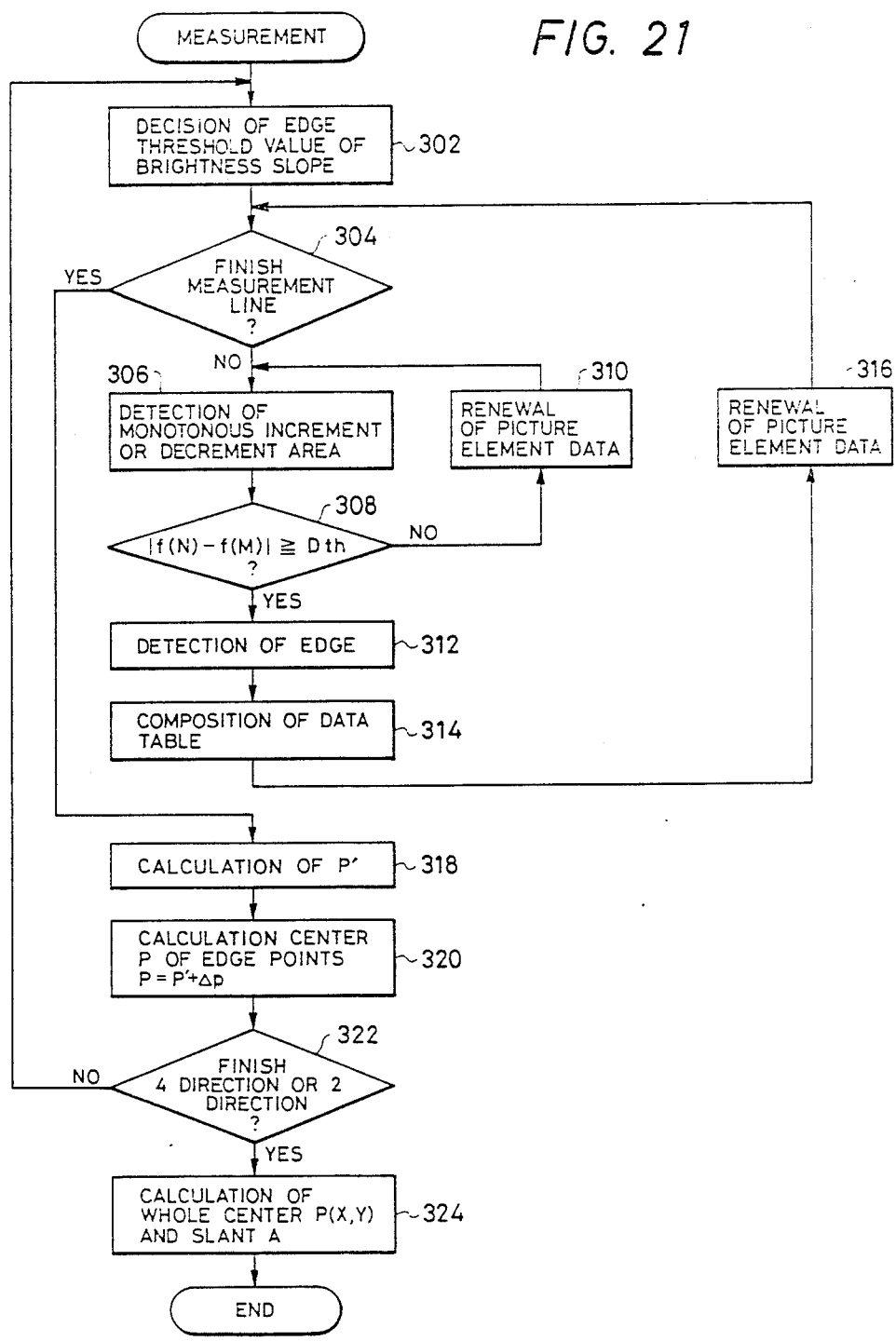

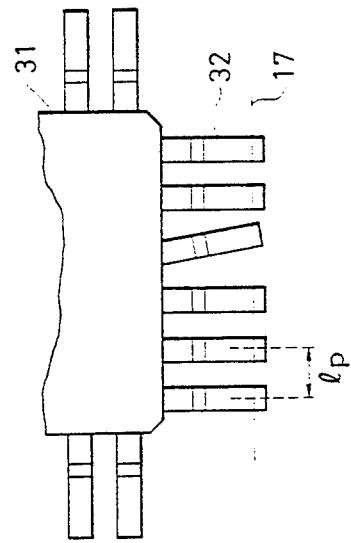
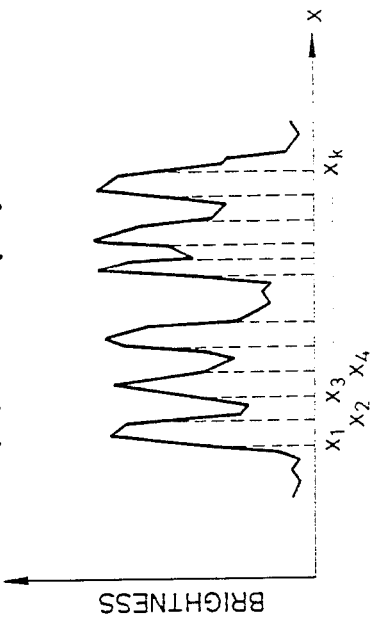
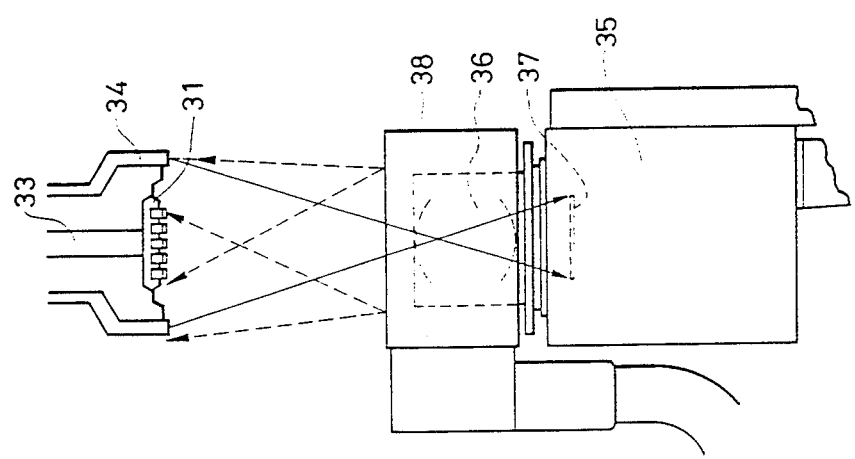

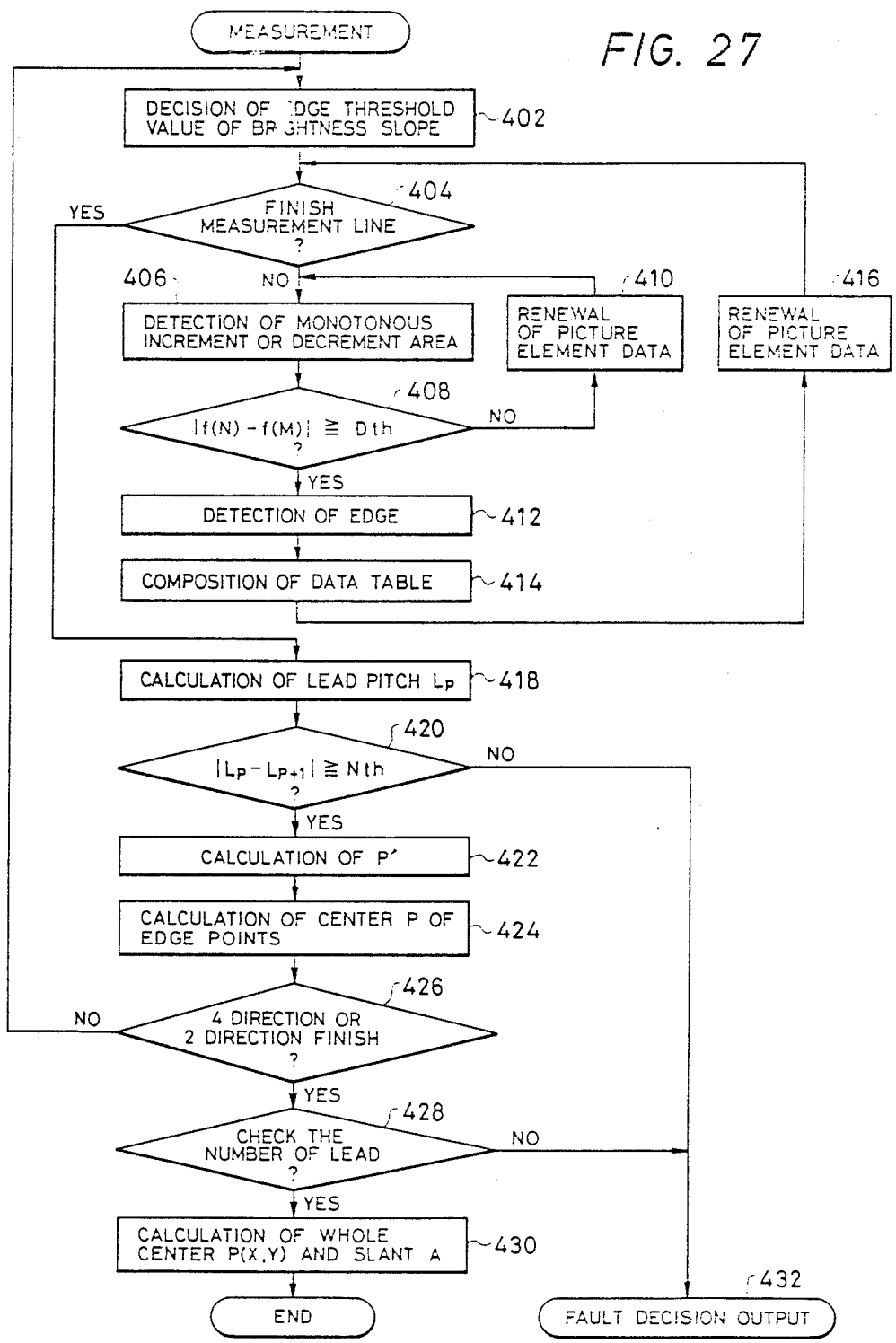

METHOD OF LOADING SURFACE MOUNTED DEVICE AND AN APPARATUS THEREFOR

BACKGROUND OF THE INVENTION

1. Field of the Invention

The present invention relates to a method of automatic loading of surface mounted devices such as the flat package type integrated circuit (IC) to the printed board and an apparatus therefor, and particularly to a method of automatic loading of the surface mounted device and an apparatus therefor, in which the automatic loading is conducted by visually positioning them.

2. Description of the Prior Art

Conventionally, with reference to the method and apparatus for mounting the electronic parts on printed circuit boards, there are examples described in Japanese Patent Laid-Open No. 1900/1985.

According to this embodiment, a special mark is previously provided on the board for positioning electronic parts onto the board and this mark is recognized during positioning of parts on the board.

In the above-mentioned prior art, the special mark other than a contact pattern is put onto the printed circuit board and the mark is read and recognized, which forms a problem. Furthermore, a TV camera is required to be moved in a special way to pick up the image of that special mark. Specifically, the pickup field of the TV camera in principle covers the entire printed circuit board, while the special mark must be provided as a small detail on a part of the board; for the detection of this small mark, the prior art picks up the zoomed image of several mark by moving the TV camera, which causes an alteration of the design of the board and an increase in the time required for recognition due to the delay incurred by moving the TV camera.

SUMMARY OF THE INVENTION

An object of the present invention is to provide a method of loading surface mounted devices and an apparatus therefor, which allows them to be automatically loaded accurately as well as promptly.

Another object of the present invention is to provide a method of loading the surface mounted devices onto the board and a method therefor, wherein, even when patterns of leads (pins) or contact patterns are irregular, the central position of the edge points not symmetric with leads or contacts can be accurately calculated, so that the positioning free of any error may be possible.

A further object of the present invention is to provide a method of loading and an apparatus therefor, in which bent leads can be detected at a high speed accurately and easily.

For this purpose, in view of the fact that, when the absolute position and orientation of the contact pattern of the surface mounted devices and the contacts on the printed circuit board onto which surface mounted devices boards are loaded can be accurately obtained respectively, relative position and orientation among them are also determined and surface mounted parts can be accurately loaded, the present invention aims at visually obtaining the absolute position and orientation of the surfaced parts and the contact pattern from the pin pattern and the contact pattern which can be generally called the contact pattern.

Furthermore, data on the portions where a straight line on the arrangement of the leads cross them is extracted from data on the planar image of the IC and bent leads are detected from the pattern of the gray scale brightness data thus extracted and further, an irregular pattern or even a partial absence of the array of the pattern of leads or contact can be corrected.

BRIEF DESCRIPTION OF THE DRAWINGS

FIGS. 8(a), 8(b), 9(a) 9(b), 10(a), 10(b) and 10(c) show the pattern of brightness along the measurement line.

FIG. 11 shows an exemplary view of the actual contact pattern.

FIGS. 12(a), 12(b), 12(c) 13(a), 13(b) and 13(c) respectively show the relationship between the edge coordinate of the contact pattern and the brightness pattern on the measurement line.

FIGS. 14(a) and 14(b) show a view, illustrating the succeeding edge points within the gradient of the concentration taken in the same direction.

FIGS. 16(a), 16(b), 16(c) and 16(d) show an explanatory view of an irregular lead array in which the omitted modification is needed.

FIG. 21 shows a flow chart, illustrating the measurement time procedure for measurement in one embodiment of the present invention.

FIG. 24 shows an explanatory view, illustrating the pickup operation in one embodiment of the method of detecting the bent leads of the IC according to the present invention.

FIGS. 25(a) and 25(b) show an explanatory view, illustrating the detecting principle, in one example, of the method of detecting bent leads of the IC according to the present invention.

FIG. 27 also shows a flow chart for explaining the operation of one embodiment.

DESCRIPTION OF THE PREFERRED EMBODIMENTS

The invention is hereinafter described in more detail with respect to the drawings, and prior to that, the theoretical background is briefly described.

In general, since the array of the pixels of the image is discrete, the minimum unit of the position to be detected from the image is a distance between pixels. However, in case of obtaining the position or orientation of a certain object, it is possible to detect the position or the orientation with a higher accuracy by averaging a plurality of sample points on the same object. The greater the number of individual sampling points is, the accuracy becomes higher, while, on the contrary, the processing speed cannot but be decreased.

By the way, in the surface mounted devices or in the contact pattern on which they are loaded, the width of pins and contacts is narrow, but their number is large, and further, their width is set constant and they are arrayed on a straight line. Furthermore, their approximate position and the orientation are previously fixed by mechanical positioning. Consequently, it is possible to draw a sampling straight line within the screen which will intersect at right angles with the pin array or the contact array of the surfaced parts. The brightness of the image on this straight line draws a waveform in correspondence to the array of pins or contacts and the position of the surface mounted devices or the contact pattern can be obtained in the direction of the sampling straight line. In general, since there are two or more arrays of pins or contacts, all of their positions and orientation can be accurately obtained by the combination of two or more arrays.

The present invention is now described more specifically.

Figure 1:
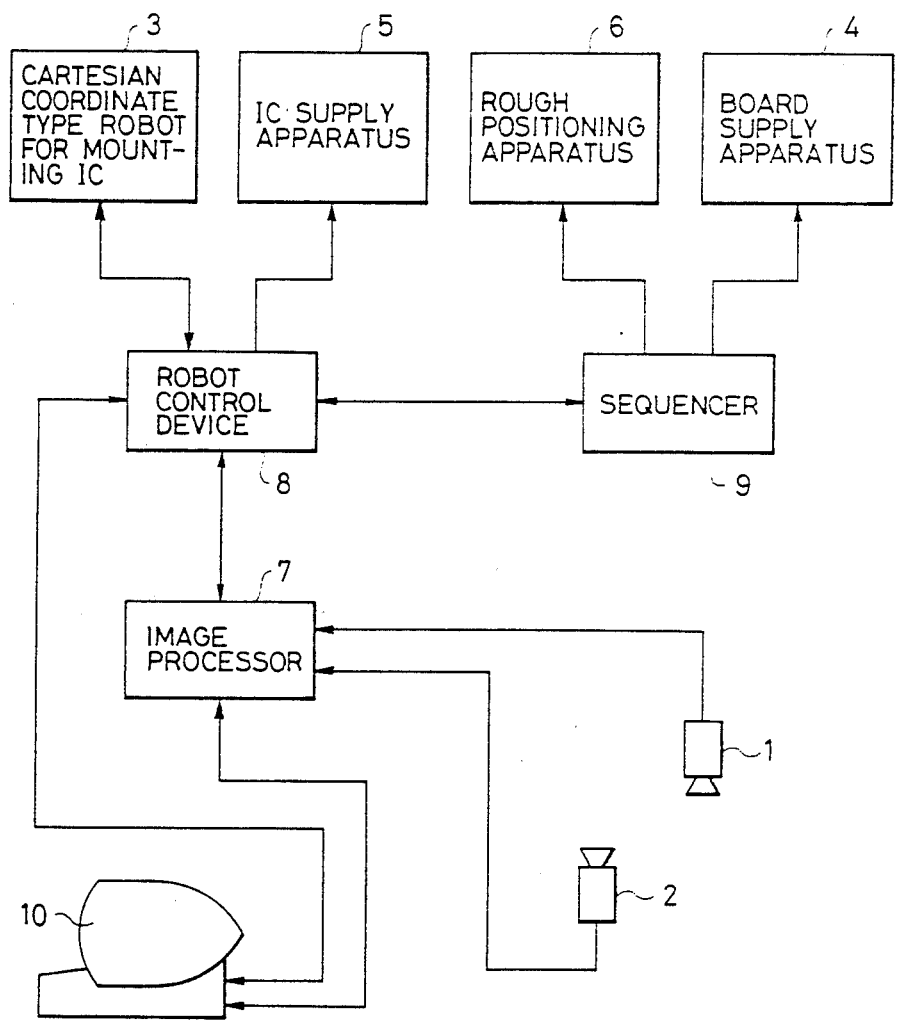
FIG. 1 shows a view, illustrating an embodiment of the present invention.

FIG. 1 shows a construction of the apparatus for automatically loading the IC onto the circuit board (surface mounter). This automatic loading apparatus consists two television cameras 1 and 2, a cartesian coordinate type robot 3 for mounting the IC, a board supply apparatus 4, an IC supply apparatus 5, a rough positioning apparatus 6, an image processor 7, a robot control device 8, a sequencer 9 and an operating unit 10.

The sequencer 9 forms a center of the entire control and performs the sequence control in accordance with the predetermined sequence program. The instruction of this sequencer controls the robot control device 8, the board supply apparatus 4 and the rough positioning apparatus 6. Since, for its operation, the sequencer 9 needs the signal sent from the robot control device 8, it takes in the signal from the robot control unit 8.

The robot control device 8 performs the control of the cartesian coordinate type robot 3 for mounting the IC and the control of the IC supply apparatus 5. The image processor 7 acquires the image picked up from the television camera 1 and 2 and processes the patterns of the printed board and the IC, so that the information for positioning the printed board and IC and loading them may be obtained. Such results are fed to the robot control device, so that the cartesian coordinate type robot 3 for mounting the IC had the IC supply apparatus 5 may be controlled, and also the board supply apparatus 4 may be controlled through the sequencer 9.

The television camera 1 is a camera for picking up the images of the vacuum gripper for grasping the IC or the board and the television camera 2 for detecting the position of the IC. The cameras 1 and 2 correspond to the cameras B and E respectively, illustrated in FIG. 3 to be described later.

The operating unit 10 is for the man-machine system, comprising a keyboard and a CRT and performs man-machine operation of image processor 7 and the robot control device 8. The board supply apparatus 4 supplys the printed board to the loading position. The IC supply apparatus 5 supplys the IC from the IC loading position to the grasping position of the robot hands. The rough positioning apparatus 6 decides the rough position of the IC.

Figure 2:
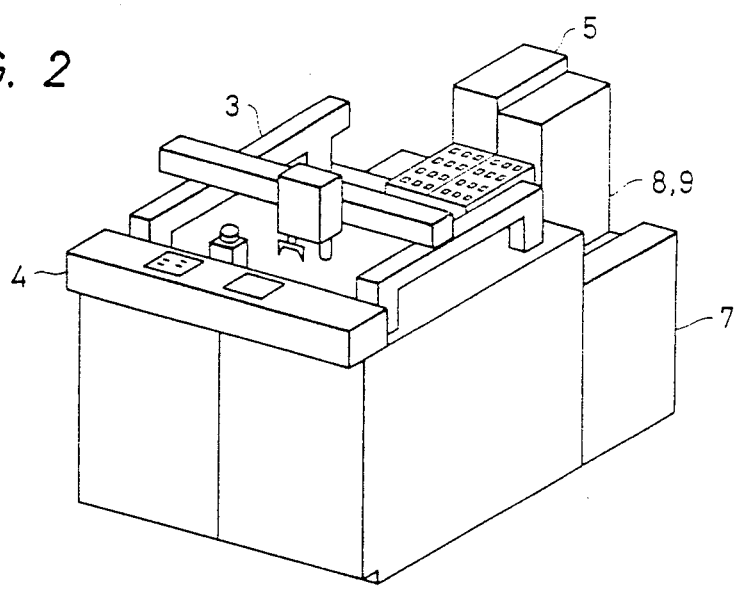
FIG. 2 show an external view of the loading machine.
Figure 3A:
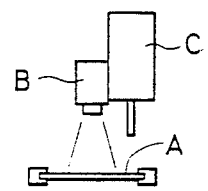
FIGS. 3(a), 3(b), 3(c) and 3(d) show a device loading processing procedure.
Figure 3B:
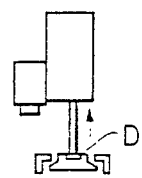
Figure 3C:
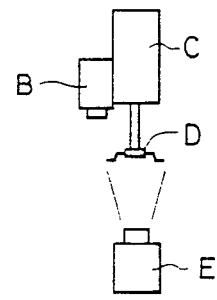
Figure 3D:
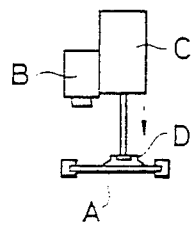

FIG. 2 shows an external view of the loading apparatus. This loading apparatus comprises the cartesian coordinate type robot 3, board supply apparatus 4, IC supply apparatus 5, image processor 7, robot control device 8 and the sequencer 9, which are set on a common base. The television cameras 1 and 2 and the operating unit 10 are omitted.

The robot may be also of an articulated or scalar type if it has a sufficient positioning accuracy, and on its hand are mounted the vacuum gripper for grasping the IC as the surface mounted device and the TV camera for picking up the board image. The other TV camera for detecting the position of the IC is fixedly mounted on the base in such a way that it may face upwardly.

Figure 4:
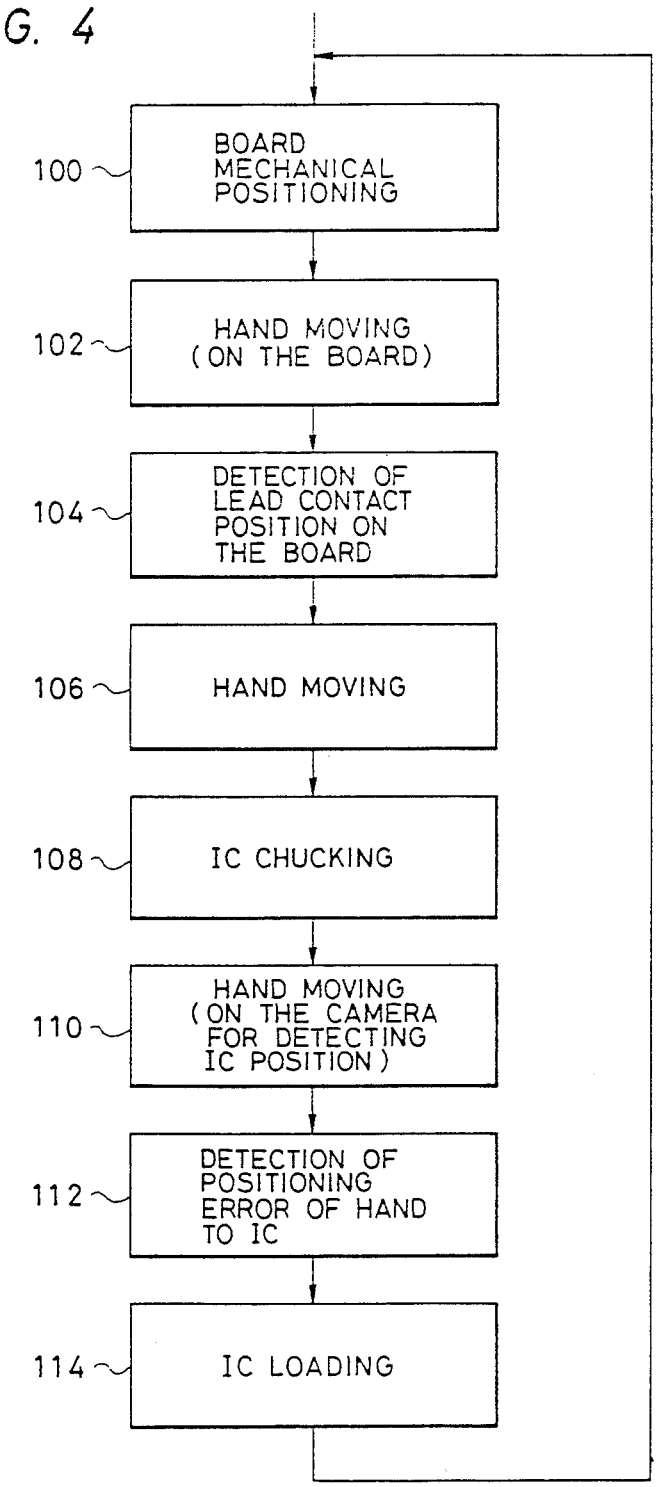
FIG. 4 shows a flow chart of the device loading.

An outline of the loading apparatus is as follows and its fundamental operation is described in FIG. 3. furthermore a flow chart of, the loading procedure is shown in FIG. 4.

(a) First, the board A is mechanically fixed (100) to the robot hand C on the board supply apparatus 4. The TV camera B is focused onto the board (102) to obtain the accurate position of the contact pattern for loading the IC on the board A (104).

(b) The robot hand C is moved to the IC rough positioning apparatus (106) and chucks (i.e., grasps) the IC (integrated circuit) D from this apparatus, while in case the hand has a rough positioning function, it chucks the IC directly from the IC supply apparatus (108).

(c) The IC D is moved onto the TV camera E for the detection of the position of the IC (110), so that the divergence between the IC D and the hand C may be detected (112).

(d) The position of the IC and the contact pattern which is obtained by the image processor 7 is fed back via the robot control device 8 to the robot, so that the IC may be aligned with and loaded onto the contact pattern on the board (114).

As described above, positioning is conducted by the image processor. How that processing is made is hereinafter described.

When the contact pattern on the printed board and the array of feet of the leads on the IC flat package which are to be detected, are picked up by the TV camera by the reflected light, they represent the bright portions, having a certain difference in contrast from the background. The distribution of the brightness on the measurement line, which is set so that it may intersect approximately vertically with respect to its pattern array, forms a waveform having a certain cycle corresponding to the array of the pattern.

The amplitude of the brightness forming the waveform is closely concerned with the frequency of the pattern array and the amplitude on the measurement line taken in the scanning direction of the television camera becomes smaller due to the condition of the measurement (for example, the array of pixels of the TV camera). However, if the contrast is greatly set and the threshold value which can be regarded as the edge is suitably set beforehand, it can be easily seen where the pattern is located.

Figure 5A:
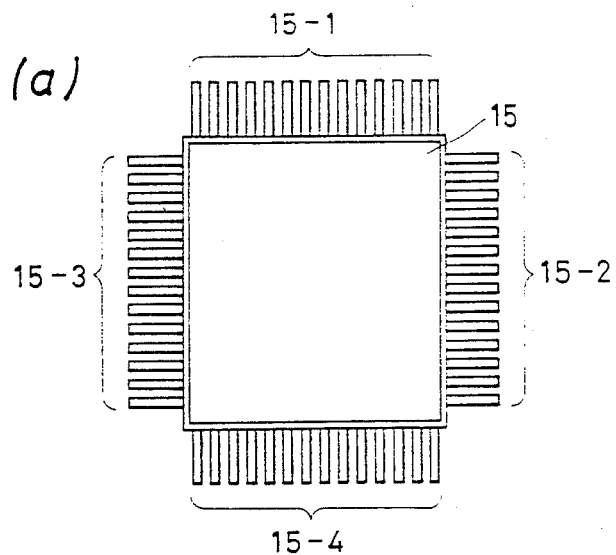
FIG. 5(a) shows a top view and FIG. 5(b) shows a side view of the integrated circuit.
Figure 5B:
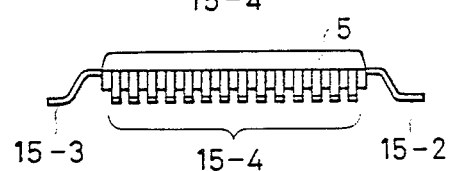
Figure 6:
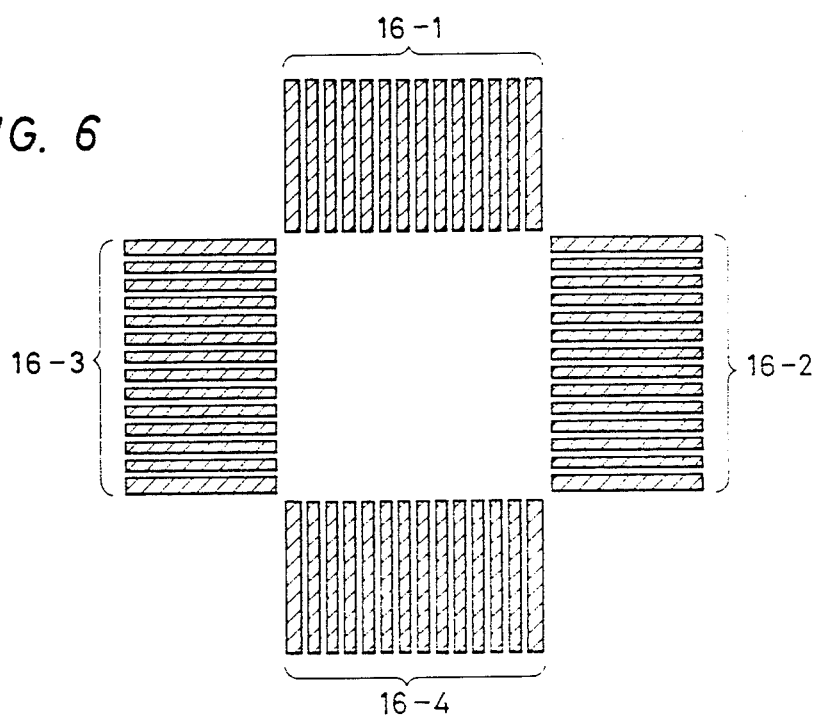
FIG. 6 shows a top view of the printed board.

The further description is as follows. As the IC to be loaded, the surface mounting package (flat package) IC is chosen, and the plan view and the elevational view are respectively shown in FIGS. 5, (a) and (b) by way of example and the contact pattern on the board on which this IC 15 is loaded is shown in FIG. 6.

As shown in FIGS., the IC 15 has four arrays of pins (leads) 15-1 to 15-4 and the contact pattern 16 comprising pin arrays 16-1 to 16-4 which correspond respectively to these contact patterns 15-1 to 15-4 formed on the board. Though the high accuracy alignment is necessary to accurately load the pin arrays of the IC on the array of the contact pattern in the corresponding state, the mechanical positioning by the board supply apparatus and the accuracy of the IC chucking by the robot are not enough. Consequently, the position is visually detected with greater accuracy, so that the information on the detected position may be fed back via the robot control device to the robot.

As described already, the detection of the position is conducted by means of the TV cameras and the image processor. One of the TV cameras is mounted to the robot hand in such a way that it may face downwardly and the contact pattern on the board is picked up, while the other is fixed onto the base in such a way that it may face upwardly, so that the IC chucked by the hand is positioned immediately thereabove. The method of detecting the position from the image from the TV camera is described as follows with respect to FIGS. 7 to 10.

The array of the contact pattern and the array of the IC pins on the board are arranged on the image along the straight lines respectively in the longitudinal direction and in a direction forming right angles thereto. However, in the actual image, the wiring pattern and the background are also picked up together.

Figure 7A:
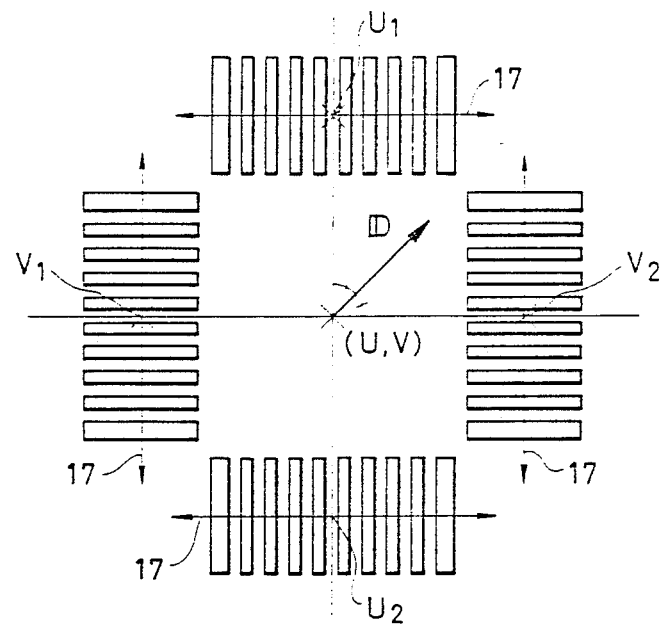
FIGS. 7(a) and 7(b) show on explanatory view of how the inclination is calculated by the measurement line in the pattern of contacts.
Figures 9A, 9B:
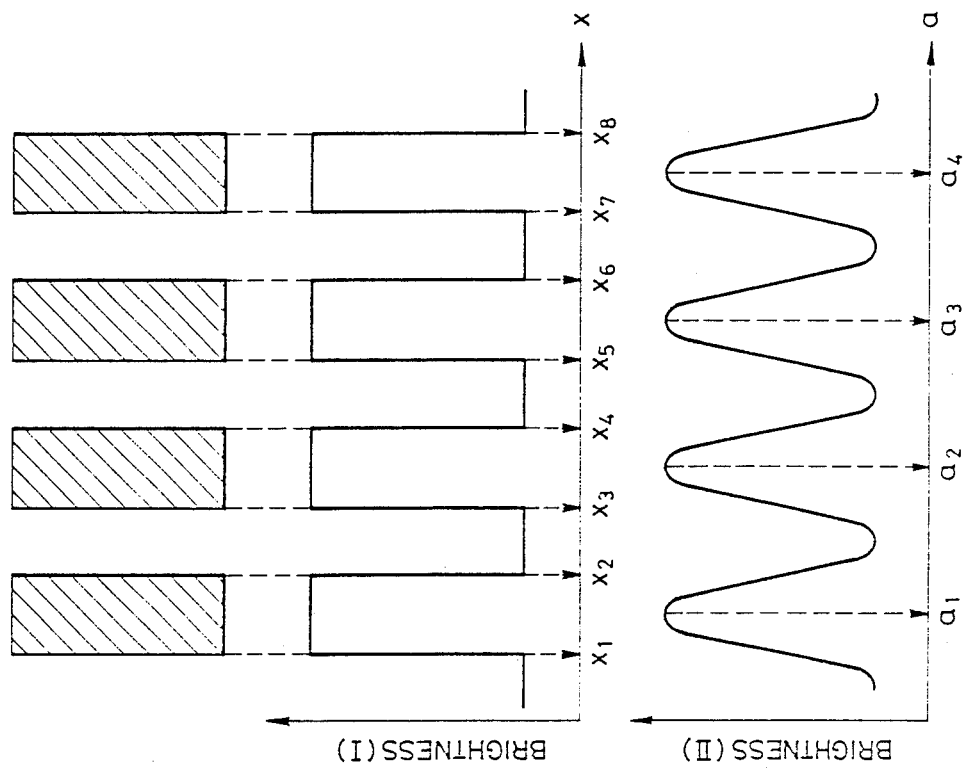

Now, if, as shown in FIGS. 7(a), (b), the measurement straight line 17 is set along each array of the rectangular pattern in the direction in which it may intersect at right angles with the rectangle and the position of the measurement straight line 17 is fixed within the screen, the position of the pattern is somewhat offset with each board and IC, but it can be mechanically positioned to such an extent that it may necessarily intersect with the sampling straight line. In this case, the brightness of the image on the measurement line 17, if the measurement line is assumed to be an X-axis, as shown in FIGS. 8(a) and (b), forms a waveform in conformity with the array of the pattern. Consequently, if the threshold reference value $B_{th}$ between the pattern and the boundary is set and is compared with the above pattern of the waveform, the boundary position $X_{i-4}$, $X_{i-3}$, ... $X_i$ on the measurement straight line is determined. As shown in FIG. 9(a) since, under the ideal condition, the waveform of the reflected light from the pattern forms a rectangle as shown as the brightness (I), the boundary of the pattern is the easiest to detect, but in case the waveform is corrupt as shown in FIG. 9(b) in the brightness (II), the crest of the mountain (maximum point) i is selected, so that the center of the pattern may be obtained.

Figures 10A, 10B, 10C:
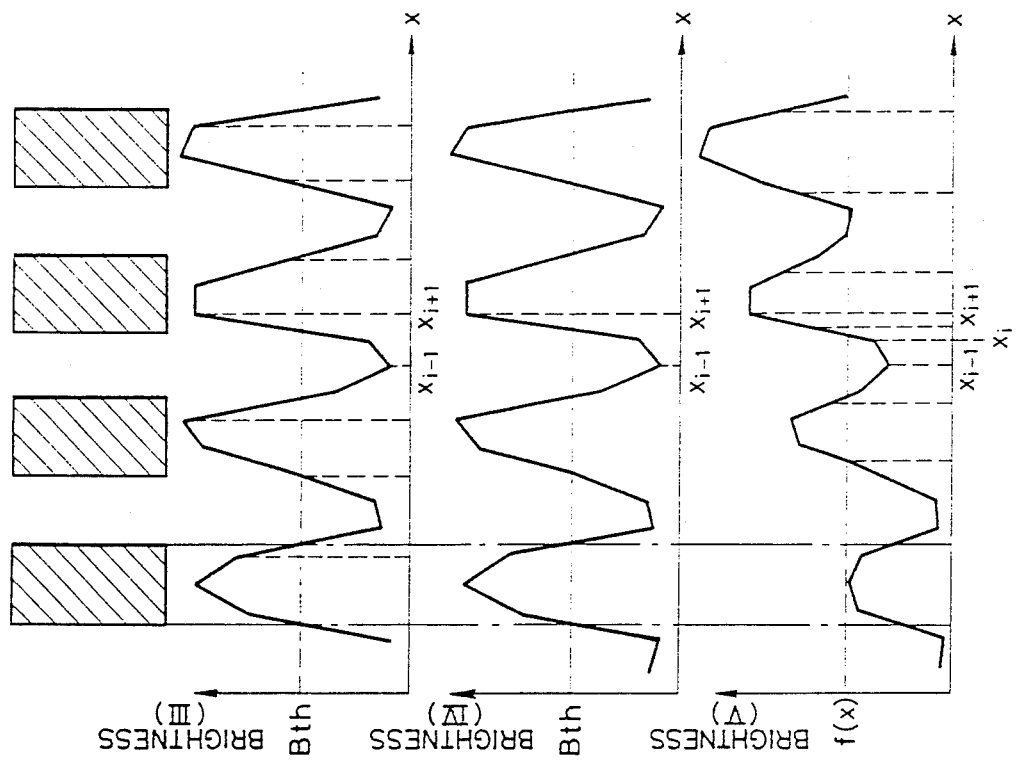

Now, a method of obtaining the boundary of the pattern is concretely described with respect to FIGS. 10(a) through 10(c). When the lighting condition is favorable and the brightness of the screen is uniform (brightness (III)), the threshold level as represented in FIG. 10(a), of the brightness may be properly set and the position of pixels at both ends of the brighter or darker range than the value thus obtained may be obtained as the boundary of the pattern. Furthermore, as shown in FIG. 10(b), under the same lighting condition, with brightness substantially identical to brightness (III) (brightness (IV)), the gradient of the brightness between pixels at both sides of the threshold value is taken into consideration and the position showing the same brightness as the threshold value is obtained in terms of the real value, the accuracy is further improved. Furthermore, in case the illumination condition is not excellent and the brightness of the screen is not uniform (The condition of brightness (V) shown in FIG. 10(c) represents that case, but in the case of other brightness (III) and (IV), too, the same can be conceived), every pattern cannot be separated by a single threshold value, but in such a case, the position of the pixel at which the gradient of the brightness between adjacent pixels becomes the greatest obtained as the boundary, or the weighted mean is obtained for each extent from the mountain to the trough.

The latter method (when the illumination condition is not excellent and the brightness of the screen is not uniform) is described as follows with respect to FIGS. 20 and 21.

Brightness (III) to (V) illustrated in FIGS. 10(a) to 10(c) has various waveforms. Consequently, the trough and the mountain can be defined in various ways. In this embodiment, portions of the curve which are monotonously increasing or decreasing are noted and in the case of the monotonous increment, its starting point is defined as the trough and its terminating point as the crest. In the case of the monotonous decrement, its starting point is defined as the crest and its terminating point as the trough (See step 206 of FIG. 20 and step 306 of FIG. 21).

Figure 20:
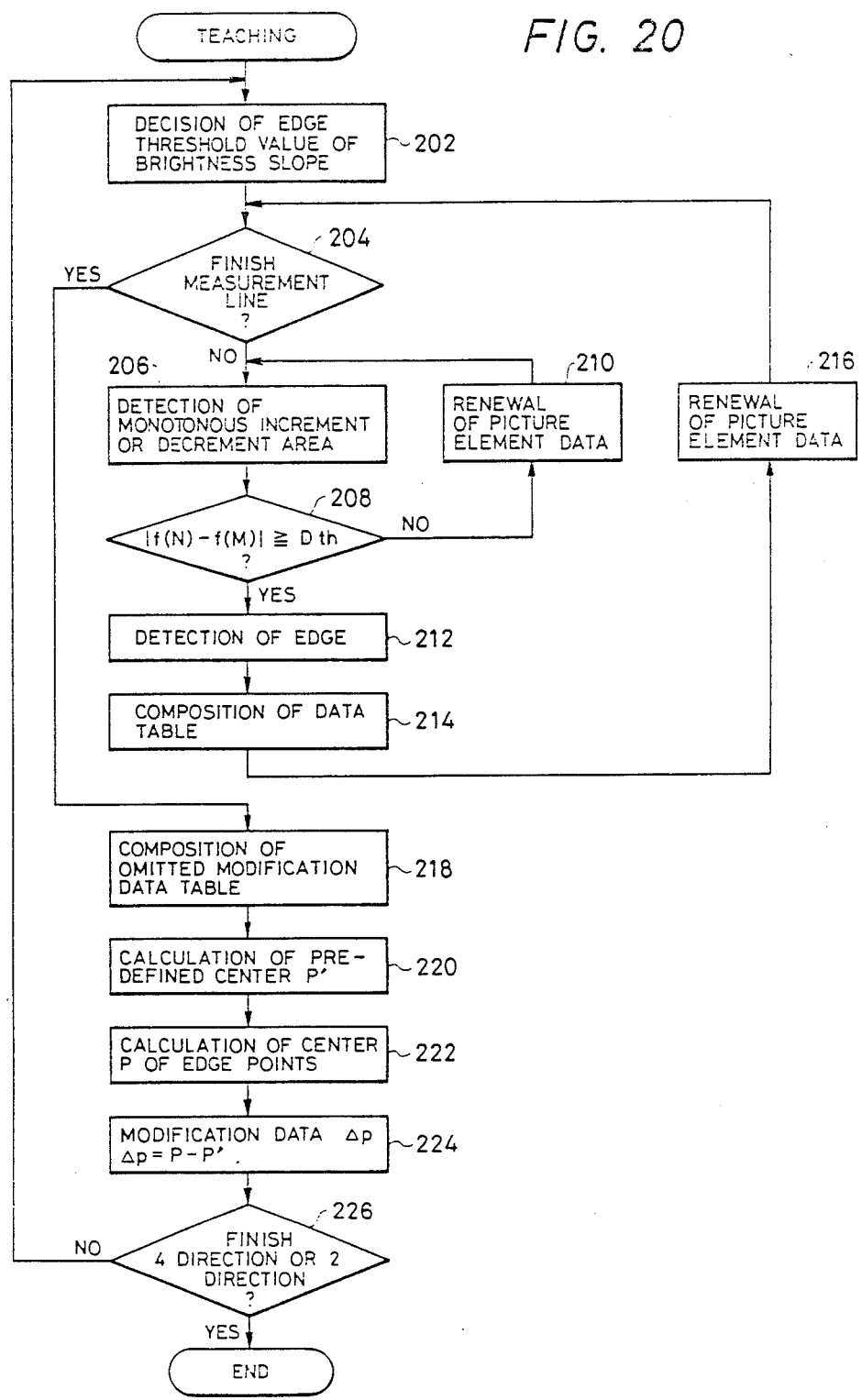
FIG. 20 shows a flow chart, illustrating the processing teaching procedure in one embodiment of the present invention.

Furthermore, in any of the monotonous increment and the monotonous decrement of the curve, it is necessary for the difference of the brightness between the crest and the trough to be above the permissible value $D_{th}$ (step 208 in FIG. 20, 308 in FIG. 21). This is because, if not viewed in that way, the crest and the trough, which do not show a very marked difference in the brightness between each other, are likely to be seen as the characterizing point of every pattern, often leading to the erroneous recognition. Therefore, the threshold value of the gradient of the concentration is to be previously selected (in other words, the edge threshold value of the brightness slope is to be previously determined) (steps 202, 302).

Referring to the examples of brightness (III), (IV) and (V) in FIGS. 10(b) and (c), the trough exists at the position of $X_{i-1}$ and the crest at the position of $X_{i+1}$. Next, the coordinate $X_k$ at the portion of the edge through the weighted mean is obtained with respect to the brightness at all of the plurality of sampling points between those troughs and the crests (steps 212, 312).

The above process can be expressed as follows. The expression whereby it is decided whether the difference is above the permissible value or not is as follows (steps 208, 308).

$$|f(N) - f(M)| \geq D_{th} \ldots \quad (1)$$

where:
$D_{th}$: threshold value of the gradient of the concentration (in other words, edge threshold value of brightness slope)
M: starting point of the monotonous increment and decrement of the concentration of the brightness
N: terminating point of the monotonous increment and the decrement of the concentration of brightness.

The expression by the weighted mean for detecting the edge is as follows (step 212, 312).

$$X_k = \frac{\sum_{i=M}^{N} (X_i + \frac{1}{2}) [|f(X_{i+1}) - f(X_i)|]}{\sum_{i=M}^{N} |f(x_{i+1}) - f(X_i)|} \quad (2)$$

where:
$X_k$: coordinate value of the edge taken along the measurement line 17
$f(x)$: brightness at the coordinate X
$f(x_i)$: X.

In this case, $X_i$ means a sampling point existing between the sampling point M and the sampling point N.

The coordinate $X_k$ of the edge by the weighted mean obtained by the expression (2) is obtained for each set of trough and crest (or crest and trough) (steps 214, 314).

If there are n pair(s) of the troughs and the crests for a single pattern array, the average value U of the coordinate $X_k$ by the weighted mean of the n set(s) is calculated $$U = \frac{\sum_{k=1}^{n} X_k}{n} \quad (3)$$

This calculated position U is regarded as the central point of one pattern array. (Steps 222 and 320). For other pattern arrays, the central points are also obtained. (Steps 202 to 226, 302 to 322).

In order to perform the above-described calculation, the memory (not shown in the drawing) within the image processor is effectively utilized. First, the memory takes in and stores the image picked up from the TV camera. Next, a measurement line is set and the image data (data on the brightness) on the measurement line is read out to be stored temporarily within the work area (table) within the memory. This content stored is data on the waveform as shown in FIGS. 10(a)–(c). Namely, this table takes the position of the measurement line 17 (sampling position) as the address and the data relates to the data on the brightness at that position. Instead, the address may be independent of the position, while the data may be composed of the position and the brightness.

Next, the content of this table is read out and the crest and the trough are found in accordance with the expression (1) and the weighted mean is obtained for each pair of the crest and the trough in accordance with the expression (2) and the coordinate $X_k$ thus obtained is registered on the table (steps 214 and 314). Subsequently, this table is searched and the mean value U is obtained for the coordinate $X_k$ in accordance with the expression (3).

When the central position taken in the direction of the measurement line was obtained for each array, the position of the entire IC and the contact pattern is obtained (step 324). Incidentally, in the flat package IC, there are two types: in one of them, pins are led out in four directions and in the other, pins are led out in two directions. In correspondence thereto, there are two image patterns, as shown in FIG. 7(a) and (b). In both cases, two arrays opposed are parallel to each other.

First, in the case of four directional pattern as shown in FIG. 7(a), coordinates U1, U2, V1 and V2 are obtained respectively as the mean value from four pattern arrays. In this case, U1 and U2 and V1 and V2 are respectively connected by the straight line and their intersecting point (U, V) is defined as the central position of the whole pattern. Further, the direction ID of a bisector of two lines is defined as the total direction. Thus this direction ID of the bisector offers the information on the offset of the rotation.

Figure 7B:
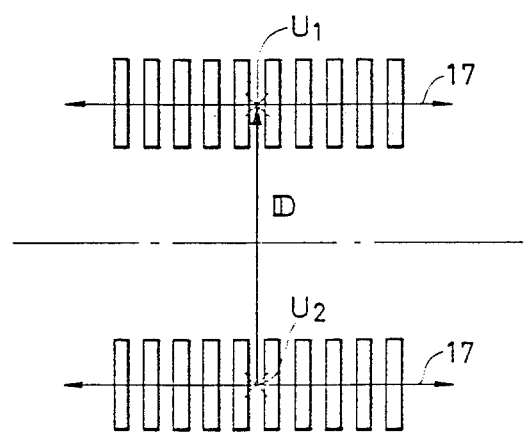

Next, in the case of the two directional pattern, as shown in FIG. 7(b), only the accuracy taken in the direction of the measurement line is important and the accuracy taken in the direction intersecting at right angles therewith can be met enough by the mechanical positioning. Consequently, the whole position is obtained, since V is fixed and U (U1+U2)/2, and the direction of the whole can be defined as the direction ID connecting U1 and U2.

Thus positions of the flat package IC and the contact pattern on the board can be accurately obtained and in accordance with such positional information, the robot can accurately load the IC as the surfaced part onto the contact pattern.

However, the pattern array is not necessarily regularly disposed, and there are also such cases in which some defects exist at a portion of the pattern array or the symmetry is impaired for the pattern array on both sides viewed from the central position. These pattern arrays are not simply defective, but are often intentionally so formed.

In such pattern arrays, even if ideas of the recognition of the crest and the trough and the weighted mean are introduced, as described above, the central position of the pattern arrays cannot be accurately detected.

However, in the present invention, even if the pattern arrays are partially absent and asymmetrical, the central position can be accurately detected. The invention is hereinafter described in detail.

A case where the width of pattern at both ends of the contact pattern array 16 on the board differs from other patterns, as shown in FIG. 11 is described. The detected value of the edge on the external side of the pattern at both ends of the pattern array is neglected and the data table is prepared. Reference numeral 20 shows a through hole and 21 a wiring pattern. In FIG. 12(a), (b), as shown in FIG. 12(c), number 0 is placed in the position of the data table in which X1 and X10 are to be stored. In the FIGS., reference numeral 16 shows a contact pattern and 17 a measurement line.

As shown in FIG. 13(a), (b), if the first edge point of the pattern array is a trailing point, it is regarded as the inner edge of the first pattern, as shown in FIG. 13(c) and X1 is put onto the second data table to prepare the data table, as in the above-described way.

There are cases where succeeding edge points having the gradient of the brightness with the same sign are detected, as shown in FIG. 14(a), but in the case of the leading edges, the detecting point X2 within the last leading edge is regarded as the edge of the pattern, and in the case of the trailing edge, the detecting point X5 within the first trailing edge is regarded as the edge of the pattern, and X1 and X6 are not regarded as the edge point. These are shown in FIG. 14(b). Incidentally, in FIG. 14(a), reference numeral 16 shows a contact pattern and 17 a measuring line and 22 a resist portion.

As described above, within the table having the odd number, values at the leading edge point are stored and values at the trailing edge points are stored within the table having the even number, so that the state of the pattern arrays may be accurately registered, as a result of which the center of the pattern array can be obtained as the mean value of the effective data which is registered into the table.

Though the present embodiment relates to the case where the pattern array is brighter than the background, if the pattern is darker than the background, the above-described definition specified for storing data into the data table may be reversed.

Figure 15:
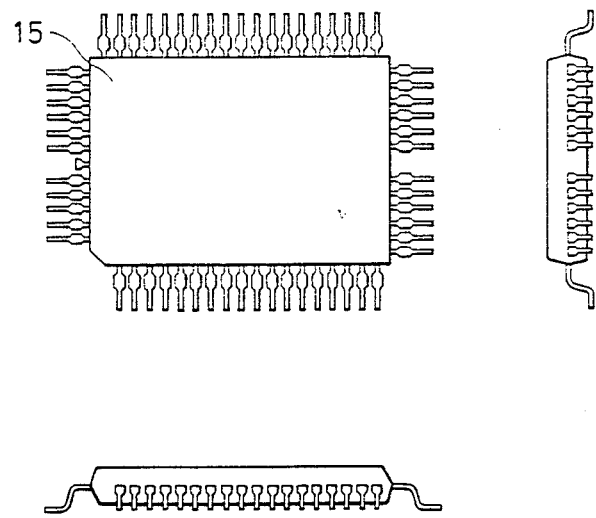
FIG. 15 shows a view, taken from the three directions of one example of the flat package type IC in which the omitted modification is needed.

Furthermore, as shown in FIG. 15, there is a flat package IC in which lead arrays are asymmetrically disposed with respect to the central point of the lead array to be obtained. In the case of the pattern array, as shown in FIG. 16(a), from the above description, the waveform of the brightness on the measuring line and the edge data result as shown in FIG. 16(a) and FIG. 16(b). In that case, since the portion PA can be regarded as the omitted pattern array, edge data X3 and X4 at the portion of PB are neglected and as shown in FIG. 16(d), the table at that portion is set to zero and the data table is prepared anew (step 218). The central point of the array can be obtained by the mean value of the effective data of the data table, as described above (step 222).

Figure 17:
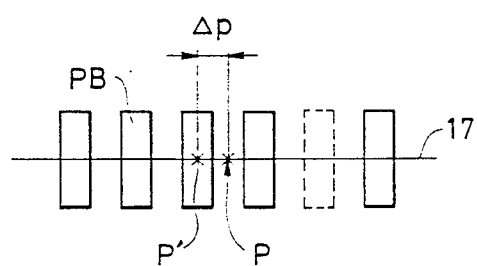
FIG. 17 shows a view, illustrating the amount of correction Δp in the method of measuring the omitted correction.

According to the present embodiment, when such modification of the omission is necessary, to accelerate the processing at the time of the measurement, data on each measuring line as well as the modification value $\Delta p$ shown in FIG. 17 are registered at the time of teaching (step 224) and at the time of the measurement, this correction value $\Delta p$ is added to or subtracted from the provisional central point P′ which can be calculated from the data table of FIG. 16(c), so that the central point P of the array may be calculated (steps 318, 320). At the time of teaching, to calculate $\Delta p$, the central point P and the pre-defined central point P′ of the array are calculated from the data table as in FIG. 16(a), (b) (steps 220 and 222). Though the portion at which the omission is modified for calculating the central point P of the array (portion PB in FIG. 17) is manually set with a view to the flexibility of the system, if the pattern array is previously determined, the information on the modification of the omission is registered within the image processor and the central point P of the array can be calculated automatically without teaching it manually.

Figure 18A:
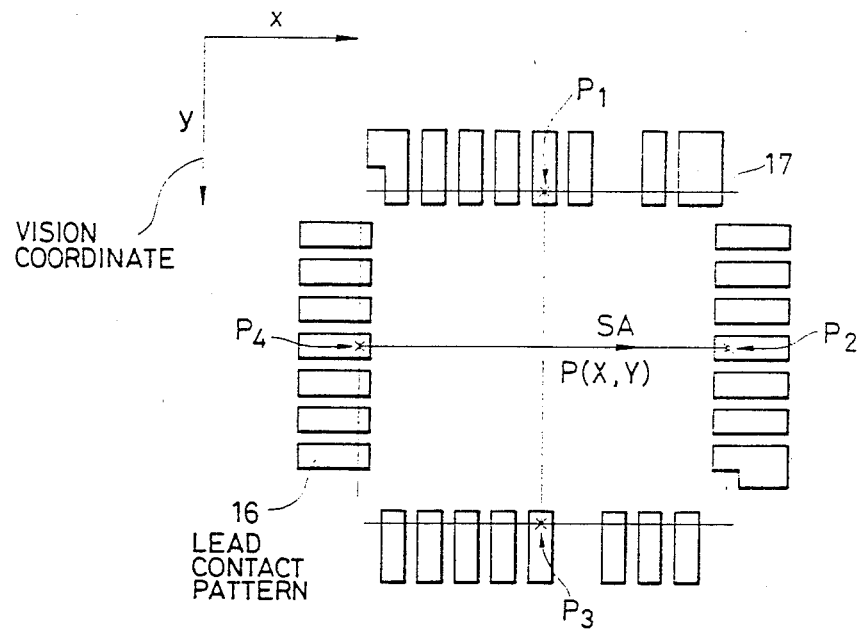
FIGS. 18(a) and 18(b) show a view, illustrating the method of measuring the position and the orientation of the entire contact pattern having the example of contacts in the four and two directions.
Figure 18B:
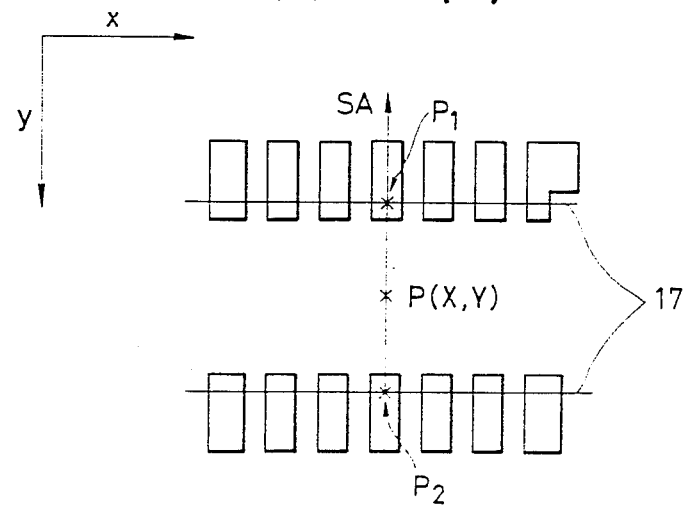
Figure 22A:
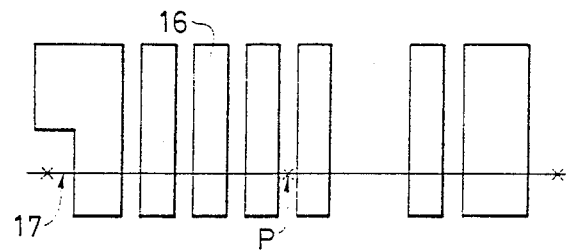
FIGS. 22(a) and 22(b) show an explanatory view, illustrating the calculation of the contact pattern and its central position.
Figure 22B:
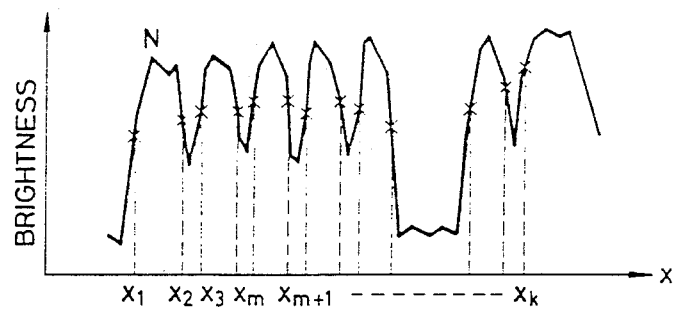

After the central point P of each array (See FIG. 22) has been obtained, as shown in FIG. 18(a), when leads are led out in four directions, the intersecting point obtained by respectively connecting P1 and P3 and P2 and P4 is taken to be a central point of the entire region and the inclination SA formed by the connecting line P2-P4 and the X-axis of the TV coordinate system (visual coordinate system) is taken to be a posture. Furthermore, when leads are led out in two directions, as shown in FIG. 18(b), the central point of the line connecting P1 with P3 is taken to be a central point of the entire region and the inclination formed by this connecting line and the X-axis is taken to be a posture, as is the above case, so that the position and the posture can be measured with a high accuracy (step 324). In the figure, as described above, reference numeral 16 shows a contact pattern and 17 a measurement line.

Figure 19A:
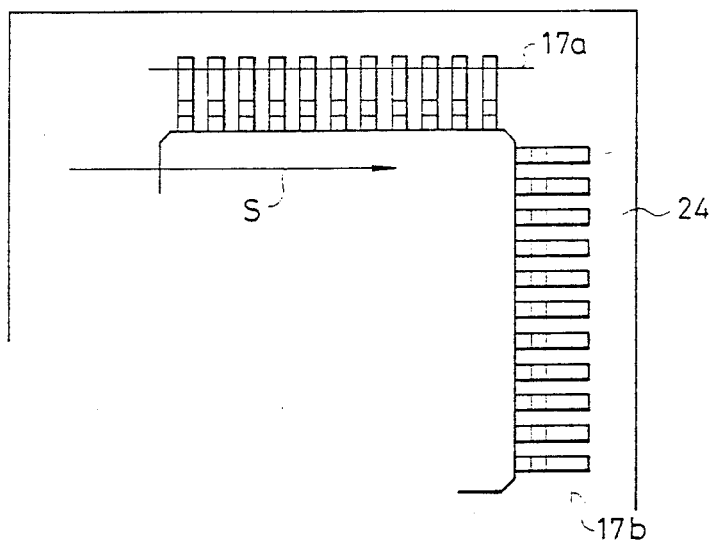
FIGS. 19(a), 19(b) and 19(c) show a view, illustrating the difference of the waveform of the brightness according to the direction of the measurement line, the scanning direction of the screen and the direction vertical thereto.
Figure 19B:
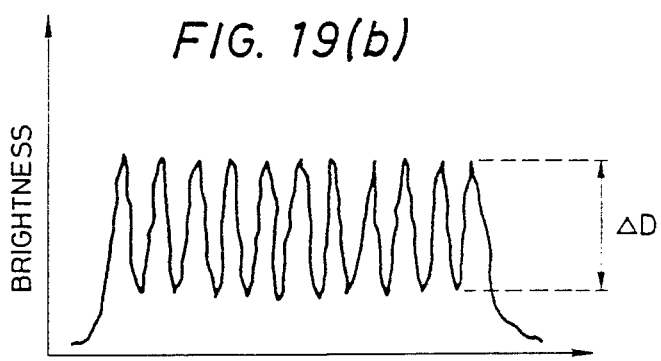
Figure 19C:
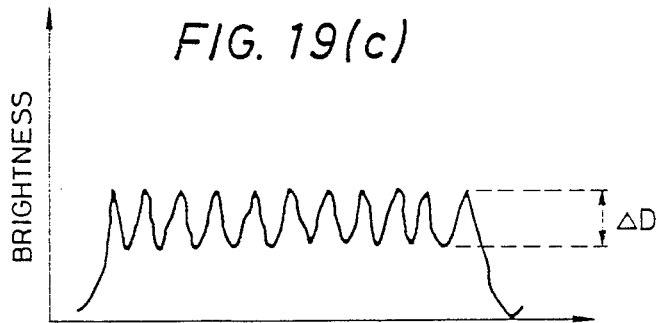

Furthermore, referring to the above-described threshold values $D_{th}$ of the gradient of the concentration which can be regarded as the edge, they show the same cycle in the direction of the measurement line with the same lead interval laterally as well as longitudinally from the characteristics of the lens, solid image pick up element of the TV camera and the circuit of the image input or the like, as in the leads array within the screen 24 shown in FIG. 19(a), but if the TV scanning direction is as shown in the figure, the waveform of the brightness of the measurement line 17 results as shown in FIG. 19(c), its height $\Delta D$ (difference of the contrast) being different. Thus in a single screen, threshold values $D_{th}$ of the gradient of the concentration are provided for each direction of the measurement line, so that the component of the noise at the background may be cut, thereby allowing only the normal edges to be extracted (steps 202 and 302).

FIG. 20 shows a flow chart of the processing at the time of teaching in progress within the image processor according to the present embodiment and FIG. 21 a flow chart of the processing at the time of measurement.

According to the present invention, positions not only of the IC having lead feet arrayed in an equal interval, but also of the IC flat package the number of the lead feet of which is asymmetrical with respect to the center, can be detected and referring to the printed board, there is no need to apply the special mark to the package at the time of manufacturing and a high accuracy detection of the position can be realized, independently of the configuration of both ends of the contact pattern array. Furthermore, since, depending on the component of the frequency of the pattern array, the threshold values which can be regarded as the edge of the pattern can be separately provided, the position can be stably detected, as a result of which the apparatus for automatically loading surfaced parts can be obtained having a high reliability and a adaptability.

By the way, in such a case, if leads of the IC which are to be loaded onto the board are bent, they cannot be accurately connected with the wiring pattern on the board. To prevent this possibility, the bend of these leads is previously inspected, so that only the IC having the accurate configuration of leads may be placed onto the board.

Figure 23A:
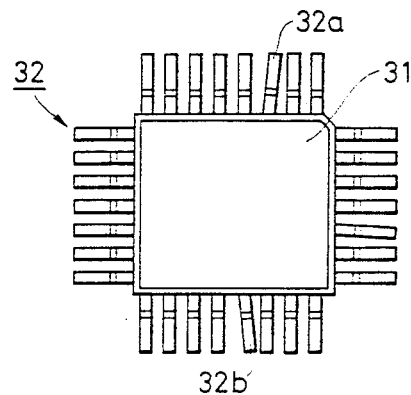
FIGS. 23(a) and 23(b) show a plan view, illustrating one example of the IC leads which are bent.
Figure 23B:
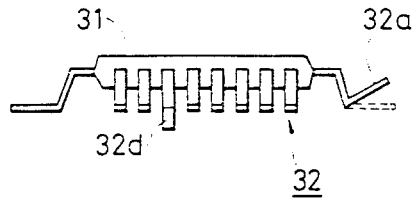

The bend of leads of this IC is now described with reference to FIG. 23. First, FIG. 23(a) is a plan vie of the flat package type IC and the reference numeral 31 shows a main body of the IC and 32 represents a lead. 32a and 32b are bent leads. Furthermore, FIG. 23(b) is a side elevational view and 32c and 32b are bent leads. The bend of the lead 32 shown in this FIG. 23(a), i.e. the bend formed along the arrayed direction of the leads array is called the lateral bend and the bend of the lead shown in FIG. 23(b), i.e. the bend in the direction forming a right angle relative to the arrayed direction of the leads array is called the longitudinal bend.

A method of detecting the bend of leads of the IC according to the present invention is hereinafter described in detail with reference to the embodiment shown.

FIG. 24 is an embodiment of the present invention and reference numeral 31 shows a flat package type IC, 33 an adsorbing hand, 34 a chuck for the gross positioning, 35 a television camera, 36 a lens, 37 an image pick up element and 38 an illuminating unit.

This embodiment is applied to the apparatus for automatically loading the IC and the adsorbing hand 33 is provided with chuck 34, and grasps and holds the IC 31 which is previously provided at a predetermined position and carries it for positioning to a predetermined location of the board which is also previously set at a predetermined position. In this case, the chuck serves to roughly decide the posture at which the IC 31 is grasped by the adsorbing hand 33.

At this time, this adsorbing hand 33 stops temporarily at the predetermined position, as described above, on the way to carrying the IC 31 from the above-mentioned predetermined position onto the board.

Meanwhile, the television camera 35 is installed immediately below the adsorbing hand 33 in correspondence to the position where this adsorbing hand 33 is once stopped, so that the image of this IC may be formed by the lens 36 precisely onto the image pick up element 37. The IC 31 which is in the adsorbed and held state is picked up at the timing when this hand 33 has just stopped and the data on the image is taken in, so that it may be stored in the memory (frame memory, not shown).

By the processing of data on the image stored within this memory, the position and the posture when the IC 31 is adsorbed to (i.e., grasped by) the hand 33 is detected and subsequently the positioning and the correction are controlled on the board, while, according to this embodiment, the bend of leads of the IC 31 is detected and it is decided whether that IC is defective or not. When an IC is determined to be defective, the IC is removed.

Next, how the bend of leads of the IC are detected in accordance with the processing of the data on the image is described.

As described already in FIG. 23, there are a lateral bend (FIG. 23(a)) and a longitudinal bend (FIG. 23(b)) for the bend of leads of the IC.

First, how the lateral bend is detected is described.

The image of the IC which was picked up as in FIG. 24 is as shown in FIG. 25(a). Within this image, the measuring line is previously provided at the predetermined position and the data extracted along this measuring line 17 is prepared.

Then the brightness of this data on the image draws a pattern as shown in FIG. 25(b).

Therefore, out of the data on the image which are stored in the form of the lattice within the frame memory, the data D at the portion corresponding to this measuring line 17 are weightedly averaged in accordance with the expression (2) and that value is taken as the coordinate $X_k$ at the edge portion of the lead.

Next, the lead pitch $lp(=|L_p-L_{p+1}|)$ between adjacent leads is obtained from these coordinates at the edge to detect the existence of the bend of the lead and from that amount, it is decided whether that IC is defective or not. The decision at that time is conducted in accordance with the following expression (4) and if the condition of this expression (4) is not met, the IC is decided to be defective.

$$|L_p-L(p+1)| < N_{th} \qquad (4)$$

where:

$N_{th}$: non-decided value $$L_1: \tfrac{1}{2}|X_3 + X_4 - X_1 - X_2|$$

$$L_p: \tfrac{1}{2}|X(k + 2) + X(k + 3) - X_k - X(k + 1)|$$

$$L(p + 1): \tfrac{1}{2}|X(k + 5) + X(k + 4) - X(k + 2) - X(k + 3)|$$

Consequently, according to this embodiment, if, as shown above, the absolute value $|L_p-L(p+1)|$ of the difference of the lead pitch between adjacent leads is decided, the amount of the bend of the lead can be obtained and the data on the image obtained by picking up the image at the time when the IC was loaded onto the board can be used as they are easy to use to detect the bend of the lead.

Next, how the longitudinal bend is detected is described. Returning to FIG. 24, in this embodiment, the image of the IC 31 is picked up by illuminating it by means of a ring light source device 38. The light source 38 uses the optical fiber, so that the light may be illuminated from the small array of the light sources which can be regarded substantially as the point light source which is disposed around the image pickup lens 36 in such a way that it may continuously surround this lens.

Figure 26:
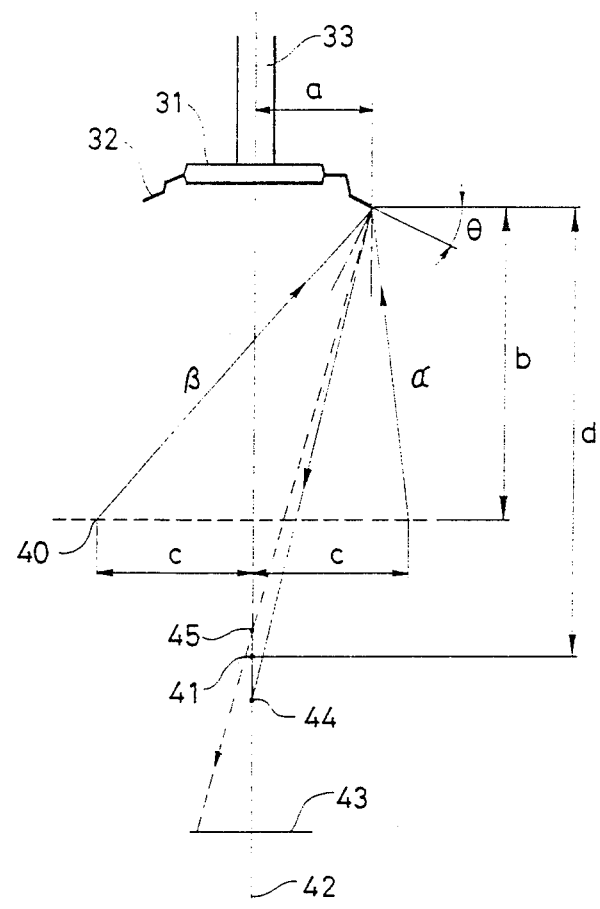
FIG. 26 shows an explanatory view, illustrating the optical system at the time of image acquisition in one embodiment.

How the image of the lead 32 is formed by this optical system according to the embodiment is shown in FIG. 26.

Reference numeral 40 shows an aperture for emitting the light by the optical fiber ring of the illuminating unit 38, 41 an optical center of the lens, 42 an optical axis of the lens, 43 an image pick up plane of the image pickup element 38, 44 a front principal point and 45 also a rear principal point.

First, beams $\alpha$ and $\beta$ illuminated from the aperture 40 for emitting the light are regularly reflected at the rear surface of the lead 32 and that reflected light reaches the image pickup plane via the lens 36 and the image is formed there.

Consequently, since the brightness of the image of the lead 32 on the image pickup plane at this time is changed, depending on the angle $\Theta$ from the horizontal plane of this lead, i.e. the amount of the bend of this lead 32, since the aperture 40 is sufficiently small and can be regarded as the point light source.

At this time, the angle when the image of the lead at the image pickup plane 43 displays the maximum amount of light is decided in accordance with the following formula.

$$\Theta\alpha = \tfrac{1}{2}[2\pi - \mathrm{Tan}^{-1}d/a - \mathrm{Tan}^{-1}b/(a+c)] \qquad (5)$$

$$\Theta\beta = \tfrac{1}{2}[\pi - \mathrm{Tan}^{-1}d/a + \mathrm{Tan}^{-1}(a-c)/b] \qquad (6)$$

where:
- a: distance from the optical axis of the lens up to the reflected plane (point) of the lead
- b: distance from the aperture up to the reflection plane (point) of the lead
- c: distance from the optical axis of the lens up to the aperture
- d: distance from the reflection plane (point) of the lead up to the optical center of the lens.

Consequently, according to this embodiment, if the construction of each portion is set so that appropriate values are given for the constants a, b, c and d in the expressions (5) and (6), only the amount of light reflected by the IC at which the value of the angle Θ exceeds the predetermined value and which is to be decided to be defective, can be set to be below the predetermined value and the longitudinal bend can be detected.

This detection is conducted by setting the threshold value $D_{th}$ of the gradient of the concentration in the expression (1) to a predetermined value. The number of the portion exhibiting the amount of the light aboe this threshold value $D_{th}$ is compared with the number of leads previously given and if they coincide with each other, that article can be decided to be excellent.

As evident from the above description, the above described decrease of the amount of light occurs due also to the absence of leads. Consequently, according to this embodiment, the IC in which leads are missing due to the damage or the like can also be simultaneously detected.

FIG. 27 schematically shows a flow chart, illustrating how the bend of leads is detected in the above-described embodiment.

First, of the data on the image which are stored within the frame memory, the one disposed along the measurement line L of a certain group of leads are transferred to a predetermined buffer.

In steps 412 and 414, in accordance with the step 408, the coordinate of the edge is detected in accordance with expressions (1) and (2), and the results are sequentially tabulated. The process up to these steps 402 to 416 is identical with the one up to the steps 302 to 316. In the step 418, the pitch distance is calculated in accordance with the expression 4 and the result is decided in the following step 420 to detect the lateral bend.

In steps 422 and 424, positioning the IC onto the board which is intrinsically asked of the automatic loading apparatus to which this embodiment is applied, is conducted.

In the step 426, it is decided whether the above-described processes have been completed for the entire leads array of the IC. Namely, in the IC, there are generally a plurality of lead arrays, as is the case with the IC shown in FIG. 23 (four arrays). Therefore, processing is repeated for each measuring line in correspondence to these plurality of lead arrays. Incidentally, in almost all cases, the number of the lead arrays is generally two and four.

In the step 428, the variation of the amount of light which is obtained by the expressions (5) and (6) is decided by the threshold value of the expression (12) and the number of leads is checked for deciding whether the article is defective or not in accordance with that result.

In the step 430, the position and the posture at which the IC is held by the adsorbing hand 33 (FIG. 24) are detected in accordance with the result obtained by the processing 424.

Consequently, according to this embodiment, since, at the time of loading the IC automatically onto the board, the bend of leads can be detected only by using the data on the image which are used for the control of this process, this invention can be applied to the automatical loading apparatus and the so-called tact time (time required for series of processings needed for mounting one IC onto the board) is not almost increased and the bend of leads can be correctly detected.

Furthermore, in the above-described embodiment, though one measuring line 17 is set for each lead array of the IC, a plurality of the measuring lines may be instead provided to conduct plural measurements in accordance with them and of the result detected by these measurement lines, the data which have displayed the maximum number of leads may be used to carry out the final detection. According to this system, the reliability of the article can be further improved.

What is claimed is:

1. A method of loading surface mounted devices chucked by a hand of an automatic control apparatus onto a contact pattern on a board, comprising steps of;
    providing a measurement line on each image pattern of arrays of contact patterns on surface parts, in such a way that the measurement line may intersect a direction of the pattern substantially at right angles,
    obtaining positions of each of said arrays of the contact patterns from variation of brightness distributed on said measurement line,
    detecting displacements of the position and rotation of the surface parts and of an entire contact pattern in accordance with said position, and
    controlling operation of said automatic apparatus while loading devices in accordance with the information on said displacements.

2. A method of loading surface mounted devices, as defined in claim 1, wherein said step of obtaining positions of each said array of the contact patterns comprises;
    specifying the position of an edge with respect to each boundary of each said array of the contact pattern, and
    calculating coordinates of the center of a pin array of one of said devices or of the contact pattern from said position of the edge, taking into consideration asymmetry and partial absence of said contact pattern.

3. A method of loading surface mounted devices, as defined in claim 1, comprising a further step of detecting any bend of each pin of a pin array of one of said devices corresponding to each said array of the contact patterns from the variation of the brightness distributed on said measurement line.

4. A method of loading surface mounted devices, as defined in claim 3, wherein said each of said surface parts is a flat package IC and said method further comprises:
    a step of determining lateral bends in an array of pins of said IC occurring along an arrayed direction of the array of pins, and
    a step of determining longitudinal bends in said array of pins in a direction intersecting at right angles with the arrayed direction of the pin array.

5. A method of loading surfaced mounted devices, as defined in claim 1, wherein an object is illuminated by a plurality of point light sources continuously disposed around an image pickup lens in such a way that said sources may surround said lens at a time of image pickup for obtaining data in a plane image of said surface parts.

6. A method of loading surface mounted devices, as defined in claim 5, wherein light emitted from end surfaces of optical fiber is used as said point light sources.

7. A loading apparatus for loading IC devices onto printed boards by registering a plurality of the contact patterns on the printed boards with a plurality of leads on the IC devices, comprising:
- image pickup means for picking up an image of one of said contact patterns or the leads,
- memory means for setting a measurement line onto a picked up one of said contact patterns or leads, and storing data on the brightness distributed along said measurement line in the order in which said one of said contact patterns or leads are arrayed,
- processing means for calculating coordinates of the center of the one of said contact patterns or leads from the data on the brightness stored within said memory means, and
- means for specifying the position and inclination of a printed board or an IC device from the coordinates of the center obtained by said processing means to register said printed circuit with said IC device.

8. A loading apparatus, as defined in claim 7, wherein said processing means specifies each edge of the one of said contact patterns or leads from said data on the brightness and calculates the coordinates of the center of the one of said contact patterns or leads from said coordinates of each edge, taking into consideration the asymmetry or the partial absence of said contact patterns or the leads.

9. A loading apparatus, as defined in claim 8, wherein, in the presence of said asymmetry and the partial absence, modification data is previously stored within the memory means, whereby coordinates of the center may be calculated from said modification data and a provisional center of the coordinates of said edge.

10. A loading apparatus, as defined in claim 7, wherein the object is illuminated by a plurality of point light sources continuously disposed around an image pickup lens in such a way that said sources may surround said lens at a time of image pickup for obtaining data in an image of the plane of said IC device.

11. A loading apparatus, as defined in claim 10, wherein light emitted from end surfaces of optical fiber is used as said point light sources.

12. A loading apparatus, as defined in claim 7, where detecting means is provided for detecting any bend in any of said leads in accordance with the data stored within said memory means.

13. A loading apparatus, as defined in claim 12, wherein said detecting means comprises:
- means for detecting a lateral bend emerging along an arrayed direction of array of leads of the IC device, and
- means for detecting a longitudinal bend emerging in the direction intersecting at right angles with an arrayed direction of the array of leads.

14. A loading apparatus, as defined in claim 12, wherein an adsorbing hand is provided for shifting the IC device to a predetermined mounting position and positioning the IC device, and any bend of said IC device is detected in accordance with the data on the picked up image of the leads of the IC device which is positioned and held by said hand.

15. A loading method for loading IC devices onto a board, comprising the steps of;
(a) mechanically fixing a board on a board supply apparatus, focusing a TV camera fixed to the hand of the robot onto said board and seeking the position of a contact pattern on the board for loading an IC device onto the board on the basis of variation in brightness distributed on a measurement line provided in such a way that the measurement line may intersect at right angles with the direction of the pattern,
(b) moving the hand to a unit for controlling gross position of the IC device and adsorbing the IC device from said apparatus,
(c) moving the IC device into a field-of-view of a TV camera and detecting the position of the IC device, so that displacement between the IC and the hand may be detected, and
(d) determining on the basis of the displacement determined, positions of the contact pattern and the IC device obtained by an image processor being fed information via a robot control device controlling the hand of the robot, so that the IC device may be loaded onto the contact pattern on the board in accurate registration.

* * * * *